US009846760B2

United States Patent
Yasui

(10) Patent No.: US 9,846,760 B2
(45) Date of Patent: Dec. 19, 2017

(54) WRITING DATA VERIFICATION METHOD AND MULTI-CHARGED PARTICLE BEAM WRITING APPARATUS

(71) Applicant: NuFlare Technology, Inc., Yokohama-shi (JP)

(72) Inventor: Kenichi Yasui, Kawasaki (JP)

(73) Assignee: NuFlare Technology, Inc., Yokohama-shi (JP)

(*) Notice: Subject to any disclaimer, the term of this patent is extended or adjusted under 35 U.S.C. 154(b) by 214 days.

(21) Appl. No.: 14/819,931

(22) Filed: Aug. 6, 2015

(65) Prior Publication Data
US 2016/0110491 A1    Apr. 21, 2016

(30) Foreign Application Priority Data

Oct. 21, 2014   (JP) .................................. 2014-214314

(51) Int. Cl.
G06F 17/50   (2006.01)
H01J 37/317  (2006.01)
H01J 37/302  (2006.01)

(52) U.S. Cl.
CPC ...... *G06F 17/5081* (2013.01); *H01J 37/3026* (2013.01); *H01J 37/3177* (2013.01); *H01J 2237/31762* (2013.01); *H01J 2237/31764* (2013.01)

(58) Field of Classification Search
None
See application file for complete search history.

(56) References Cited

U.S. PATENT DOCUMENTS 4,774,461 A * 9/1988 Matsui ................... G06T 7/001
                                                              348/126
4,803,734 A * 2/1989 Onishi ................ G01N 21/956
                                                              382/115
(Continued)

FOREIGN PATENT DOCUMENTS

CN    101275917 A    10/2008
JP    2001-344302  * 12/2001 ............ G06F 17/50
(Continued)

OTHER PUBLICATIONS

Combined Taiwanese Office Action and Search Report dated Dec. 26, 2016 in patent application No. 104130443 with English translation of categories of cited documents.

*Primary Examiner* — Leigh Garbowski
(74) *Attorney, Agent, or Firm* — Oblon, McClelland, Maier & Neustadt, L.L.P.

(57) ABSTRACT

In one embodiment, a writing data verification method is for verifying a conversion error due to data conversion from first writing data in a vector format based on design data to second writing data in a pixel format. The method includes converting the second writing data to third writing data in a vector format, performing an exclusive OR operation on the first writing data and the third writing data, enlarging a graphic of the first writing data to obtain an enlarged graphic and generating a tolerance region graphic from a difference between the enlarged graphic and the graphic of the first writing data, and detecting a defect by performing a mask process on a graphic generated by the exclusive OR operation with the tolerance region graphic.

16 Claims, 7 Drawing Sheets

(56) References Cited

U.S. PATENT DOCUMENTS

| | | | | |
|---|---|---|---|---|
| 5,046,109 A * | 9/1991 | Fujimori | ............... | G06K 9/4609 |
| | | | | 382/144 |
| 5,048,094 A * | 9/1991 | Aoyama | ............... | G01R 31/308 |
| | | | | 382/151 |
| 5,475,766 A * | 12/1995 | Tsuchiya | ............ | G01N 21/8851 |
| | | | | 345/441 |
| 5,657,397 A * | 8/1997 | Bokser | ................. | G06K 9/6218 |
| | | | | 382/160 |
| 6,901,569 B2 * | 5/2005 | Aoki | .................... | G06F 17/5081 |
| | | | | 430/30 |
| 7,689,029 B2 * | 3/2010 | Onishi | .................... | G06T 7/001 |
| | | | | 382/144 |
| 8,255,441 B2 * | 8/2012 | Kasahara | ............. | G06F 17/5068 |
| | | | | 708/200 |
| 8,300,918 B2 * | 10/2012 | Yamada | ................ | G06T 7/0004 |
| | | | | 382/141 |

FOREIGN PATENT DOCUMENTS

| | | |
|---|---|---|
| JP | 2004-56068 | 2/2004 |
| JP | 2007-233866 | 9/2007 |
| JP | 2008-177224 | 7/2008 |
| JP | 2008-242885 A | 10/2008 |
| JP | 2009-111148 | 5/2009 |
| KR | 10-2008-0089175 A | 10/2008 |
| TW | 201132962 A1 | 10/2011 |

* cited by examiner

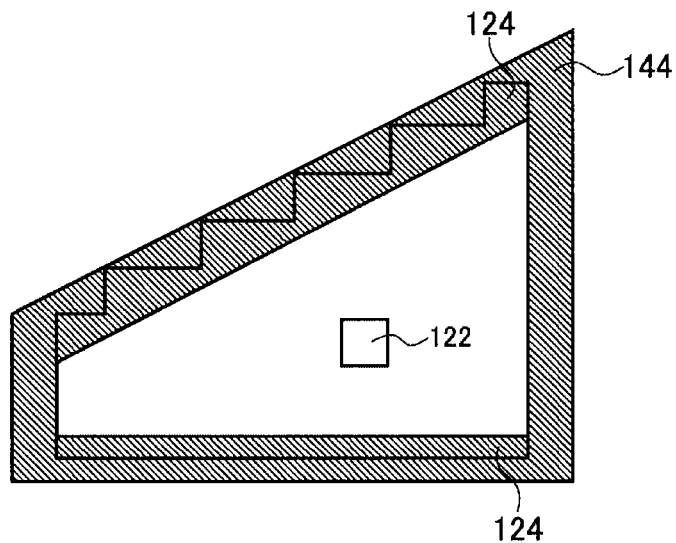

WRITING DATA VERIFICATION METHOD AND MULTI-CHARGED PARTICLE BEAM WRITING APPARATUS

CROSS REFERENCE TO RELATED APPLICATION

This application is based upon and claims benefit of priority from the Japanese Patent Application No. 2014-214314, filed on Oct. 21, 2014, the entire contents of which are incorporated herein by reference.

FIELD

The present invention relates to a writing data verification method and a multi-charged particle beam writing apparatus.

BACKGROUND

With an increase in the density of LSI, the circuit line width of semiconductor devices has decreased through the years. To form a desired circuit pattern for such semiconductor devices, an original image pattern (i.e., a mask or, particularly, a reticle for use in steppers or scanners) with high precision formed on quartz is transferred onto a wafer with its size reduced by using reduction projection light-exposure apparatus. The original image pattern with high precision is written by an electron beam writing apparatus, i.e., with a so-called electron beam lithography technique.

Known electron beam writing apparatuses are a variable shaped electron beam writing apparatus and a multi-beam writing apparatus. The variable shaped electron beam writing apparatus forms an electron beam into a rectangle or an isosceles right triangle by using two shaping apertures, and applies an electron beam on a mask as a writing object. On the other hand, the multi-beam writing apparatus causes an electron beam emitted from an electron gun to pass through an aperture member with a plurality of holes to form multi-beams. Each of the beams is blanking-controlled. The beams which have not been blocked are applied onto a mask as a writing target.

In the case of performing electron beam writing with a variable shaped electron beam writing apparatus, a layout of a semiconductor integrated circuit is first designed, and design data (CAD data) is generated as layout data. Then, the format of the design data is converted such that the converted data can be processed in the writing apparatus, and writing data is generated. For example, in the writing data, a writing pattern such as a graphic is defined by coordinates of vertices of the graphic.

The design data and the writing data are vector data. In a conventional technique, to check matching in shape between data before data conversion and data after the data conversion, an exclusive OR (XOR) operation is performed on the design data and the writing data, and a difference is detected as a defect (conversion error).

In the case of performing electron beam writing with a multi-beam writing apparatus, the format of design data is converted so that vector writing data is generated, and then the vector writing data is converted to pixel writing data, and the pixel writing data is input to the writing apparatus.

In detecting the presence of an conversion error occurring when vector writing data is converted to pixel writing data, vector data and pixel data are used for comparison. Thus, the conventional technique described above cannot be applied without change.

BRIEF DESCRIPTION OF THE DRAWINGS

FIG. 8A illustrates an example of a mask process using a tolerance region graphic, and FIG. 8B illustrates an example of a conversion error in pixel writing data.

DETAILED DESCRIPTION

In one embodiment, a writing data verification method is for verifying a conversion error due to data conversion from first writing data in a vector format based on design data to second writing data in a pixel format. The method includes converting the second writing data to third writing data in a vector format, performing an exclusive OR operation on the first writing data and the third writing data, enlarging a graphic of the first writing data to obtain an enlarged graphic and generating a tolerance region graphic from a difference between the enlarged graphic and the graphic of the first writing data, and detecting a defect by performing a mask process on a graphic generated by the exclusive OR operation with the tolerance region graphic.

Embodiments of the present invention will be described hereinafter with reference to the drawings.

First Embodiment

A writing data verification method according to a first embodiment of the present invention is intended to detect a conversion error occurring when writing data in a vector format generated from design data is converted to the writing data in the pixel format in conformity with an internal format of a multi-charged particle beam writing apparatus. Prior to description of the writing data verification method, a multi-charged particle beam writing apparatus will be described.

Figure 1:
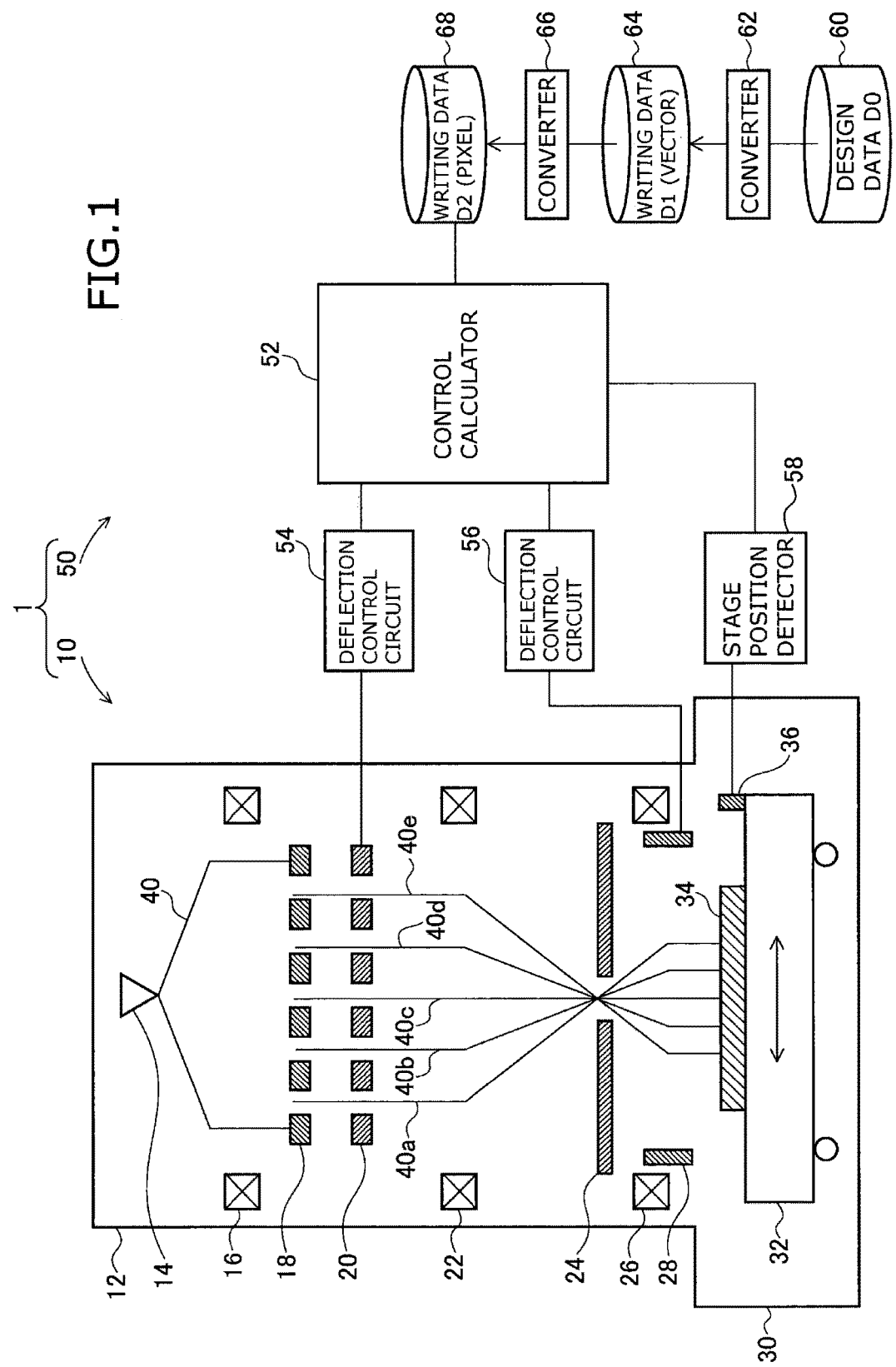
FIG. 1 schematically illustrates a multi-charged particle beam writing apparatus.

FIG. 1 schematically illustrates a multi-charged particle beam writing apparatus. Here, a configuration using an electron beam as an example of a charged particle beam will be described. The charged particle beam is not limited to an electron beam and may be another charged particle beam such as an ion beam.

A writing apparatus 1 illustrated in FIG. 1 includes a writing section 10 that applies an electron beam onto an object such as a mask or a wafer and writes a desired pattern and a control section 50 that controls a writing operation performed by the writing section 10. The writing section 10 includes an electron beam barrel 12 and a writing chamber 30.

The electron beam barrel 12 houses an electron gun 14, an illuminating lens 16, an aperture member 18, a blanking plate 20, a reducing lens 22, a limiting aperture member 24, an objective lens 26, and a deflector 28. The writing chamber 30 contains an XY stage 32. A mask blank 34 serving as a writing object substrate is placed on the XY stage 32. Examples of the object include a wafer and a mask for exposure with which a pattern is transferred to the wafer with reduction projection light-exposure apparatus such as a stepper or a scanner using an excimer laser as a light source or extreme ultraviolet light-exposure apparatus. Examples of the writing object substrate include a mask on which a pattern has been already formed. For example, a Levenson phase-shifting mask requires two writing operations. Thus, a second pattern can be written on an object which has been written and processed as a mask, in some cases. A mirror 36 for positioning the XY stage 32 is also placed on the XY stage 32.

The control section 50 includes a control calculator 52, deflection control circuits 54 and 56, and a stage position detector 58. The control calculator 52, the deflection control circuits 54 and 56, and the stage position detector 58 are connected to each other with a bus.

An electron beam 40 emitted from the electron gun 14 substantially perpendicularly illuminates the entire aperture member 18 with the illuminating lens 16. The aperture member 18 has apertures (openings) that are arranged in matrix at a predetermined arrangement pitch. The electron beam 40 illuminates a region on the aperture member 18 including all the apertures. Part of the electron beam 40 passes through the apertures, thereby forming multi-beams 40a to 40e as illustrated in FIG. 1.

The blanking plate 20 has penetration holes whose locations coincide with the locations of the apertures in the aperture member 18. Blankers of a pair of two electrodes are disposed at each of the penetration holes. The electron beams 40a to 40e passing through the penetration holes are deflected independently of each other by voltages applied from the blankers. The blanking control is performed with this deflection. In this manner, the blankers perform blanking deflection on corresponding beams of the multi-beams that have passed through the apertures in the aperture member 18.

The multi-beams 40a to 40e that have passed through the blanking plate 20 are reduced by the reducing lens 22 and go toward a center hole in the limiting aperture member 24. The electron beams deflected by the blankers of the blanking plate 20 deviate from the center hole in the limiting aperture member 24 and are blocked by the limiting aperture member 24. On the other hand, electron beams not deflected by the blankers of the blanking plate 20 pass through the center hole in the limiting aperture member 24.

In this manner, the limiting aperture member 24 blocks deflected beams so as to turn the beams off with the blankers of the blanking plate 20. Beams that have passed through the limiting aperture member 24 from when the beams are turned on to when the beams are turned off serve as beams corresponding to one shot. The multi-beams 40a to 40e that have passed through the limiting aperture member 24 are focused by the objective lens 26 and form a pattern image with a desired reduction ratio. The beams (entire multi-beams) that have passed through the limiting aperture member 24 are deflected in the same direction by the deflector 28 and applied to the corresponding locations on the mask blank 34.

While the XY stage 32 continuously moves, the locations onto which the beams are applied are controlled by the deflector 28 such that the locations follow the movement of the XY stage 32. The XY stage 32 is caused to move by a stage control section (not shown), and the position of the XY stage 32 is detected by the stage position detector 58.

Multi-beams applied at a time are ideally arranged at a pitch obtained by multiplying the arrangement pitch of apertures in the aperture member 18 by the desired reduction ratio described above. The writing apparatus performs writing operation with a raster scan technique in which shot beams are consecutively applied, and in writing a desired pattern, necessary beams are controlled to be on by blanking control in accordance with the pattern. While the XY stage 32 continuously moves, the locations onto which the beams are applied are controlled by the deflector 28 such that the locations follow the movement of the XY stage 32.

The control calculator 52 reads writing data D2 in a pixel format from a memory device 68, and performs data conversion in a plurality of stages so as to generate shot data specific to the apparatus. In the shot data, an irradiation amount and irradiation location coordinates, for example, of each shot are defined.

Based on the shot data, the control calculator 52 outputs an irradiation amount for each shot to the deflection control circuit 54. The deflection control circuit 54 divides the input irradiation amount by a current density and obtains an irradiation time t. In performing a corresponding shot, the deflection control circuit 54 applies a deflection voltage to a corresponding blanker of the blanking plate 20 such that the blanker is in the beam-on state for the irradiation time t.

The control calculator 52 outputs deflect location data to the deflection control circuit 56 such that a beam is deflected to a location (coordinates) indicated by the shot data. The deflection control circuit 56 calculates a deflection amount and applies a deflection voltage to the deflector 28. In this manner, multi-beams corresponding to a shot are deflected at a time.

When a layout of the semiconductor integrated circuit is designed and design data (CAD data) D0 serving as layout data is generated, the design data D0 is stored in a memory device 60. The design data D0 is converted by a converter 62, thereby generating writing data D1. The writing data D1 is stored in the memory device 64. In the writing data D1, a writing pattern such as a graphic is defined by coordinates of apices of the graphic. The design data D0 and the writing data D1 are data in vector formats.

The converter 66 converts the writing data D1 in the vector format to writing data D2 in a pixel format such that the data matches an internal format of the writing apparatus 1. In this manner, the writing data D2 to be input to the control calculator 52 of the writing apparatus 1 is generated. The generated writing data D2 is stored in the memory device 68. In the following description, the writing data D1 in the vector format and the writing data D2 in the pixel format will be respectively referred to as vector writing data D1 and pixel writing data D2.

Figure 2:
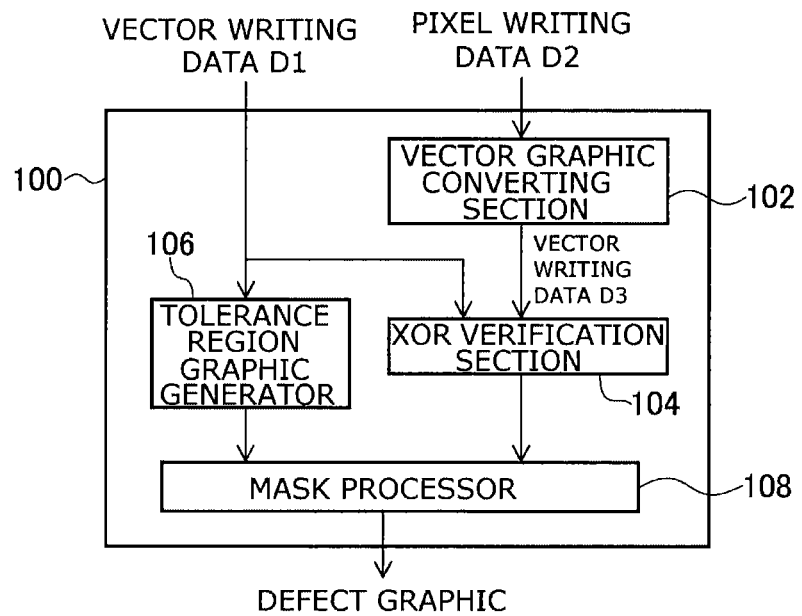
FIG. 2 schematically illustrates a writing data verification apparatus according to a first embodiment.

A writing data verification method will now be described. FIG. 2 schematically illustrates a writing data verification apparatus according to this embodiment. As illustrated in FIG. 2, a writing data verification apparatus 100 includes a vector graphic converting section 102, an XOR verification section 104, a tolerance region graphic generator 106, and a mask processor 108.

Figure 3:
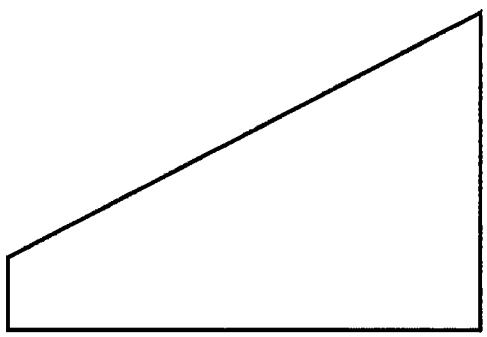
FIG. 3 illustrates an example of writing data in a vector format.
Figures 4, 5:
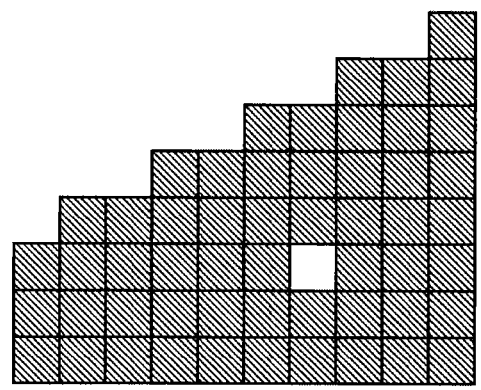
FIG. 4 illustrates an example of writing data in a pixel format.
FIG. 5 illustrates an example of writing data in a vector format converted from the writing data in the pixel format.

The writing data verification apparatus 100 receives vector writing data D1 and pixel writing data D2 and detects an conversion error (defect) occurring when the converter 66 converts the vector writing data D1 to the pixel writing data D2. FIGS. 3 and 4 respectively show examples of the vector writing data D1 and the pixel writing data D2 to be input to the writing data verification apparatus 100. The pixel writing data D2 shown in FIG. 4 uses the values of meshes (pixels) as an area ratio.

The vector graphic converting section 102 converts the pixel writing data D2 to writing data D3 in a vector format. Specifically, pixels having values except 0 (zero) are converted to a rectangle at the same location with the same size as the frame of the pixels. The vector writing data D3 after the conversion has a writing pattern of a graphic of a rectangle group. For example, in the case of converting the pixel writing data D2 illustrated in FIG. 4, vector writing data D3 as illustrated in FIG. 5 is generated.

The XOR verification section 104 performs an exclusive OR (XOR) operation on the vector writing data D1 and the vector writing data D3 generated by the vector graphic converting section 102. The XOR operation is performed on the vector writing data D1 and rectangles included in a rectangle group of the vector writing data D3. Through the XOR operation, a difference graphic between the vector writing data D1 and the vector writing data D3 is generated.

Figure 6:
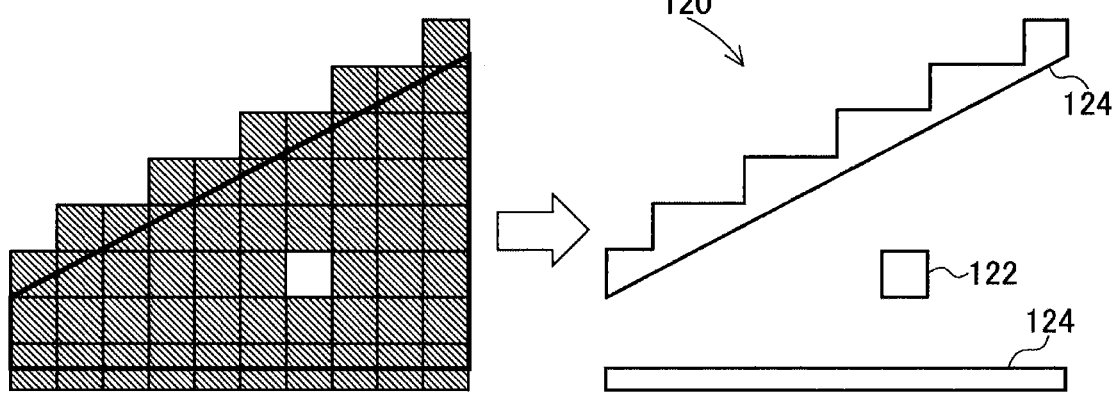
FIG. 6 illustrates an example of an XOR operation.

For example, an XOR operation is performed on the vector writing data D1 shown in FIG. 3 and the vector writing data D3 shown in FIG. 5, thereby obtaining a difference graphic 120 as shown in FIG. 6. The difference graphic includes not only a true defect 122 but also a pseudo defect 124. The pseudo defect 124 occurs because of mismatching between a side of a vector graphic and the boundary of pixels or approximation of an arbitrary angle of a vector graphic.

Figure 7A:
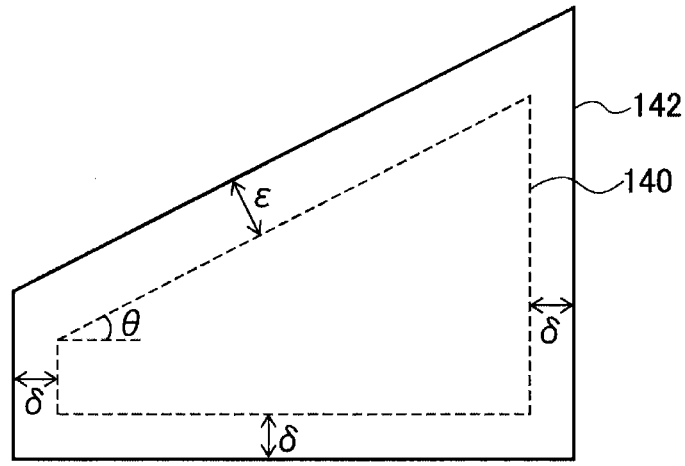
FIG. 7A illustrates an example of an enlarged graphic.
Figure 7B:
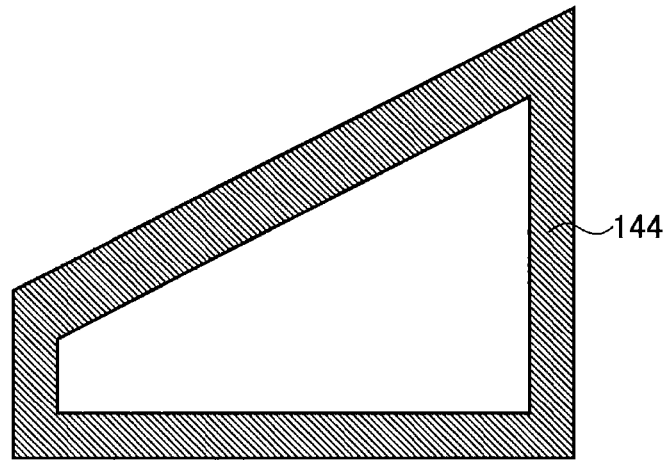
FIG. 7B illustrates an example of a tolerance region graphic.

The tolerance region graphic generator 106 enlarges a graphic of the vector writing data D1 and generates a tolerance region graphic from a difference between the enlarged graphic and the graphic of the vector writing data D1 (i.e., the difference between graphics before and after the enlargement). For example, as illustrated in FIG. 7A, a graphic 140 of the vector writing data D1 is enlarged, thereby obtaining an enlarged graphic 142. Then, as illustrated in FIG. 7B, a ring-shaped tolerance region graphic 144 (hatched area in the drawing) that is a difference graphic between the enlarged graphic 142 and the graphic 140 is generated.

In enlarging the graphic 140 of the vector writing data D1, an enlarged width δ with respect to the horizontal and vertical sides is $\delta = \text{PixSize} - 1$ au, and an enlarged width ε with respect to an oblique side is $\epsilon = \text{PixSize} \times (\cos\theta + \sin\theta) - 1$ au. Here, a PixSize is a size of a pixel frame, and au is a minimum irradiation unit of a beam. If the enlarged width is greater than or equal to the PixSize, a true defect might be overlooked in a mask process, which will be described later. Thus, the enlarged width is smaller than the PixSize.

The mask processor 108 masks the difference graphic generated by the XOR verification section 104 with the tolerance region graphic generated by the tolerance region graphic generator 106, and removes a difference graphic in the tolerance region graphic. This mask process removes a pseudo defect included in the difference graphic and enables detection of only a true defect.

For example, as illustrated in FIG. 8A, the difference graphic 120 is masked with the tolerance region graphic 144 so that the pseudo defect 124 is removed and the true defect 122 is detected. As illustrated in FIG. 8B, a pixel corresponding to the true defect 122 is a conversion error (defect) occurring when the converter 66 converts the vector writing data D1 to the pixel writing data D2.

In this embodiment, the tolerance region graphic 144 is generated from the enlarged graphic 142 obtained by enlarging the vector writing data D1, and the mask process is performed using the tolerance region graphic 144. Thus, a pseudo defect included in the difference graphic between the vector writing data D3 obtained by converting the pixel writing data D2 to a vector graphic and the vector writing data D1 can be removed. Accordingly, it is possible to accurately detect a conversion error occurring when the vector writing data D1 generated from the design data D0 is converted to the pixel writing data D2 that matches the internal format of the multi-charged particle beam writing apparatus.

Second Embodiment

In the first embodiment described above, a pseudo defect included in the difference graphic between the vector writing data D3 obtained by converting the pixel writing data D2 to the vector graphic and the vector writing data D1 is removed by the mask process using the tolerance region graphic 144. Alternatively, an XOR operation may be performed on an enlarged graphic of vector writing data D1 and vector writing data D3 such that a difference graphic (true defect) including no pseudo defects is detected.

Figure 9:
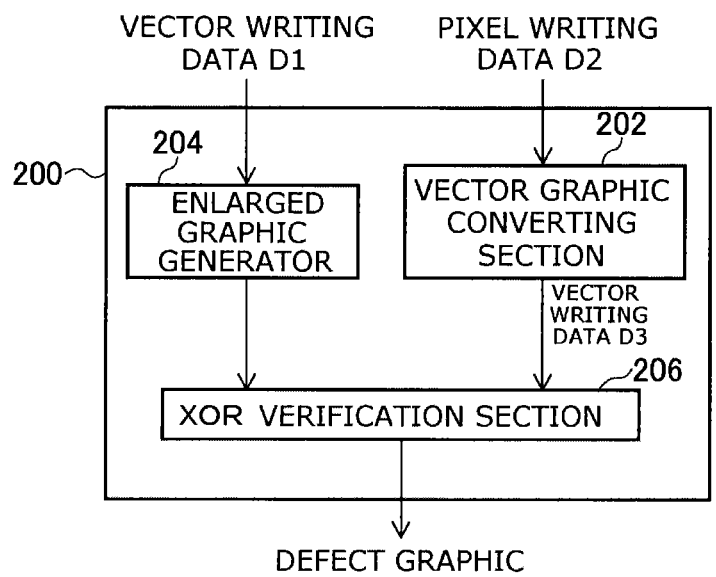
FIG. 9 schematically illustrates a writing data verification apparatus according to a second embodiment.

FIG. 9 schematically illustrates a writing data verification apparatus according to a second embodiment. As illustrated in FIG. 9, a writing data verification apparatus 200 includes a vector graphic converting section 202, an enlarged graphic generator 204, and an XOR verification section 206. Vector writing data D1 and pixel writing data D2 to be input to the writing data verification apparatus 200 are the same as those in the first embodiment.

The vector graphic converting section 202 is the same as the vector graphic converting section 102 in the first embodiment, and converts pixel writing data D2 to writing data D3 in a vector format.

The enlarged graphic generator 204 enlarges a graphic of the vector writing data D1 and generates an enlarged graphic. This process is the same as a process of the first embodiment in which the graphic 140 of the vector writing data D1 is enlarged and the enlarged graphic 142 is generated as illustrated in FIG. 7A.

The XOR verification section 206 performs an XOR operation on the vector writing data D3 generated by the vector graphic converting section 202 and the enlarged graphic generated by the enlarged graphic generator 204. The XOR operation is performed on each rectangle included in a rectangle group of the vector writing data D3 and the enlarged graphic. Through the XOR operation, a difference graphic between the vector writing data D3 and the enlarged graphic is generated.

Figure 10:
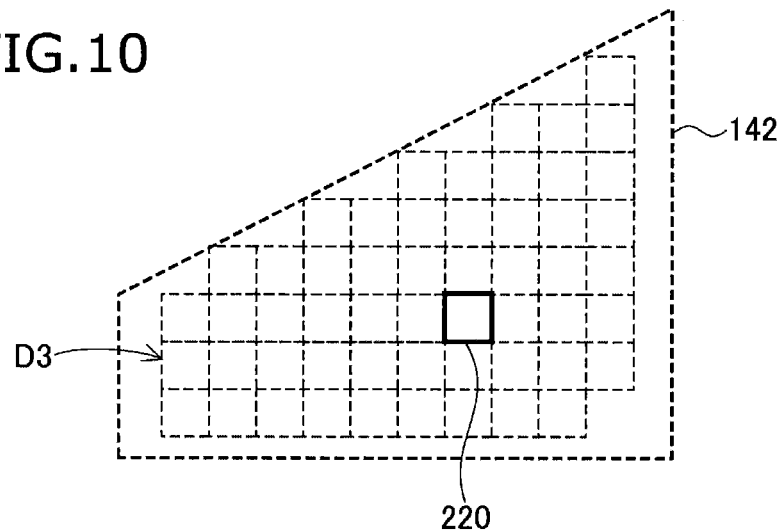
FIG. 10 illustrates an example of an XOR operation.

For example, the XOR operation is performed on the vector writing data D3 shown in FIG. 5 and the enlarged graphic 142 shown in FIG. 7A, thereby obtaining a difference graphic 220 shown in FIG. 10. The difference graphic 220 does not include a pseudo defect, and only a true defect is detected.

In this manner, in the second embodiment, in consideration of a pseudo defect due to mismatching between a side of a vector graphic and the boundary of pixels and occurring in converting the vector writing data D1 to the pixel writing data D2 and approximation of an arbitrary angle of a vector graphic, the XOR operation is performed on the enlarged graphic obtained by enlarging the graphic of the vector writing data D1 and the vector writing data D3, thereby detecting a difference graphic of only a true defect including no pseudo defects. Accordingly, it is possible to accurately detect a conversion error occurring when the vector writing data D1 generated from the design data D0 is converted to the pixel writing data D2 that matches the internal format of a multi-charged particle beam writing apparatus.

Figure 11:
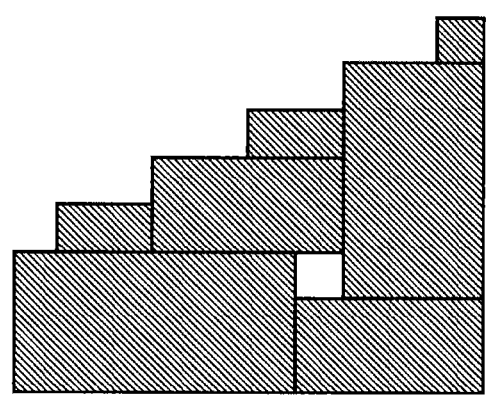
FIG. 11 illustrates an example of grouping of rectangles.

In the first and second embodiments, the XOR operation is performed on each rectangle included in a rectangle group of the vector writing data D3. The number of XOR operations is greater than or equal to the number of pixels having values except 0 (zero). Here, before the XOR operation, as illustrated in FIG. 11, a plurality of rectangles are grouped in a large rectangle such that an XOR operation is performed on the group (large rectangle). In this manner, the number of XOR operations can be reduced, thereby increasing the process efficiency.

The writing data verification apparatuses 100 and 200 may additionally include a display showing a detected defect and a memory storing a detection result, for example.

The verification of writing data in the first and second embodiments may be performed in the control calculator 52 of the writing apparatus 1. For example, the control calculator 52 may be provided with the function of the writing data verification apparatus 100 or 200 and the function of the converter 66 such that when the vector writing data D1 is input, the control calculator 52 converts the vector writing data D1 to the pixel writing data D2 and verifies the presence of an error (defect) caused by the conversion. The control calculator 52 may be additionally provided with the converter 62 such that when the design data D0 is input, the control calculator 52 converts the design data D0 to the vector writing data D1.

At least part of the writing data verification apparatuses 100 and 200 described in the above embodiments may be implemented in either hardware or software. When implemented in software, a program that realizes at least part of functions of the writing data verification apparatuses 100 and 200 may be stored on a recording medium such as a flexible disk or CD-ROM and read and executed by a computer. The recording medium is not limited to a removable recording medium such as a magnetic disk or optical disk, but may be a non-removable recording medium such as a hard disk device or memory.

The program that realizes at least part of the functions of the writing data verification apparatuses 100 and 200 may be distributed through a communication line (including wireless communications) such as the Internet. Further, the program may be encrypted, modulated, or compressed to be distributed through a wired line or wireless line such as the Internet or to be distributed by storing the program on a recording medium.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A writing data verification method for verifying a conversion error due to data conversion from first writing data in a vector format based on design data to second writing data in a pixel format, the method comprising:
converting the second writing data to third writing data in a vector format;
performing an exclusive OR operation on the first writing data and the third writing data;
enlarging a graphic of the first writing data to obtain an enlarged graphic and generating a tolerance region graphic from a difference between the enlarged graphic and the graphic of the first writing data; and
detecting a defect by performing a mask process on a graphic generated by the exclusive OR operation with the tolerance region graphic.

2. The writing data verification method according to claim 1, wherein
an enlarged width in enlarging the graphic of the first writing data is smaller than a size of a pixel frame of the second writing data.

3. The writing data verification method according to claim 1, further comprising:
generating the third writing data by converting a pixel having a value except 0 in the second writing data to a rectangle at an identical location with an identical size to the pixel frame.

4. The writing data verification method according to claim 3, wherein
a plurality of rectangles that are included in the third writing data and correspond to pixels of the second writing data are grouped, and
the exclusive OR operation is performed on grouped rectangles.

5. The writing data verification method according to claim 1, wherein
the tolerance region graphic has a ring shape.

6. A multi-charged particle beam writing apparatus comprising:
a writing section that writes a pattern by forming multi-beams of a plurality of charged particle beams, turning on or off each of the multi-beams individually, and irradiating an object with the charged particle beams; and
a control section that controls the writing section based on second writing data in a pixel format converted from first writing data in a vector format based on design data, converts the second writing data to third writing data in a vector format, performs an exclusive OR operation on the first writing data and the third writing data, enlarges a graphic of the first writing data to obtain an enlarged graphic, forms a tolerance region graphic from a difference between the enlarged graphic and the graphic of the first writing data, and detects a defect by masking a graphic produced through the exclusive OR operation with the tolerance region graphic.

7. The multi-charged particle beam writing apparatus according to claim 6, wherein
an enlarged width in enlarging the graphic of the first writing data is smaller than a size of a pixel frame of the second writing data.

8. The multi-charged particle beam writing apparatus according to claim 6, wherein
the control section generates the third writing data by converting a pixel having a value except 0 in the second writing data to a rectangle at an identical location with an identical size to the pixel frame.

9. The multi-charged particle beam writing apparatus according to claim 8, wherein
the control section groups a plurality of rectangles that are included in the third writing data and correspond to pixels of the second writing data, and performs the exclusive OR operation on grouped rectangles.

10. The multi-charged particle beam writing apparatus according to claim 6, wherein the tolerance region graphic has a ring shape.

11. The multi-charged particle beam writing apparatus according to claim 6, wherein
the control section converts the first writing data and generates the second writing data.

12. The multi-charged particle beam writing apparatus according to claim 11, wherein
the control section converts the design data to generate the first writing data.

13. A writing data verification method for verifying a conversion error occurring when first writing data in a vector format based on design data is converted to second writing data in a pixel format, the method comprising:
converting the second writing data to third writing data in a vector format;
obtaining an enlarged graphic by enlarging a graphic of the first writing data;
detecting a defect by performing an exclusive OR operation on the enlarged graphic and a graphic of the third writing data.

14. The writing data verification method according to claim 13, wherein
an enlarged width in enlarging the graphic of the first writing data is smaller than a size of a pixel frame of the second writing data.

15. The writing data verification method according to claim 13, further comprising:
generating the third writing data by converting a pixel having a value except 0 in the second writing data to a rectangle at an identical location with an identical size to the pixel frame.

16. The writing data verification method according to claim 15, wherein
a plurality of rectangles that are included in the third writing data and correspond to pixels of the second writing data are grouped, and
the exclusive OR operation is performed on grouped rectangles.

* * * * *